United States Patent
Nirschl

(10) Patent No.: US 7,986,024 B2
(45) Date of Patent: Jul. 26, 2011

(54) FUSE SENSING SCHEME

(75) Inventor: Thomas Nirschl, Essex Junction, VT (US)

(73) Assignee: Infineon Technologies AG, Neubiberg (DE)

( * ) Notice: Subject to any disclaimer, the term of this patent is extended or adjusted under 35 U.S.C. 154(b) by 587 days.

(21) Appl. No.: 11/770,956

(22) Filed: Jun. 29, 2007

(65) Prior Publication Data
US 2009/0002119 A1    Jan. 1, 2009

(51) Int. Cl.
*H01H 85/30* (2006.01)
(52) U.S. Cl. ........................................ 257/529; 337/206
(58) Field of Classification Search .................... 257/529
See application file for complete search history.

(56) References Cited

U.S. PATENT DOCUMENTS

| 6,091,273 | A | * | 7/2000 | Bernstein et al. | 327/321 |
| 2004/0218328 | A1 | | 11/2004 | Kuzuno et al. | |
| 2007/0064508 | A1 | * | 3/2007 | Sugimura | 365/200 |

* cited by examiner

*Primary Examiner* — Jarrett J Stark
*Assistant Examiner* — Lawrence Tynes, Jr.
(74) *Attorney, Agent, or Firm* — Eschweiler & Associates, LLC

(57) ABSTRACT

A fuse circuit includes a fuse configured for programming a configuration of an integrated circuit device and a resistive element having a known resistance value operably coupled in parallel with the fuse. The fuse and the resistive element form a parallel circuit configured for quickly sensing a state of the fuse in relation to the known value of the resistive element. In one embodiment, the device may further include a sense circuit operably coupled to the parallel circuit combination of the fuse and the resistive element. The sense circuit is configured to sense one of a FUSED state and an UNFUSED state of the fuse, for example, based on a comparison between a reference resistance and a FUSED resistance of the fuse when coupled to the known resistance. The fuse may comprise a programmable fuse, and the resistive element may comprise a MOS transistor.

19 Claims, 4 Drawing Sheets

# US 7,986,024 B2

FUSE SENSING SCHEME

FIELD OF INVENTION

The present invention relates generally to semiconductors and more particularly to improved methods and devices for sensing the state of a programmable fuse.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

To reconfigure logic, such as that which is used to store redundancy information for memory macros, electrically programmable or optically programmable fuses are often used. These fuses are generally melted (fused) by means of a high power external pulse provided either by a voltage or current pulse, or a laser pulse. Such fuses or fuse logic may be used to provide address information or other kinds of logic information. The FUSED or UNFUSED states of a fuse are usually sensed by means of a sense amplifier or complex logic circuitry. Sensing or confirming the state of a fuse may be problematic as the resistance is unknown after "fusing" the device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a device and method for quickly sensing the state of a programmable fuse, or other such programmable elements. A known resistance is placed parallel to the fuse element to provide a fuse circuit or parallel circuit combination having a more controlled or well defined range of possible resistance values than may be possible without the known parallel resistance. The fuse circuit may then be more quickly and accurately compared to a reference resistance, for example, using simple sensing or logic comparison circuits to determine the FUSED or UNFUSED state of the fuse. In one embodiment, the fuse and known resistance are placed local to each other, or spatially disposed adjacent to each other to minimize local variations between the characteristics of the elements. A sense circuit may also be provided associated with one or more respective fuses configured to read the state of the respective fuse.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
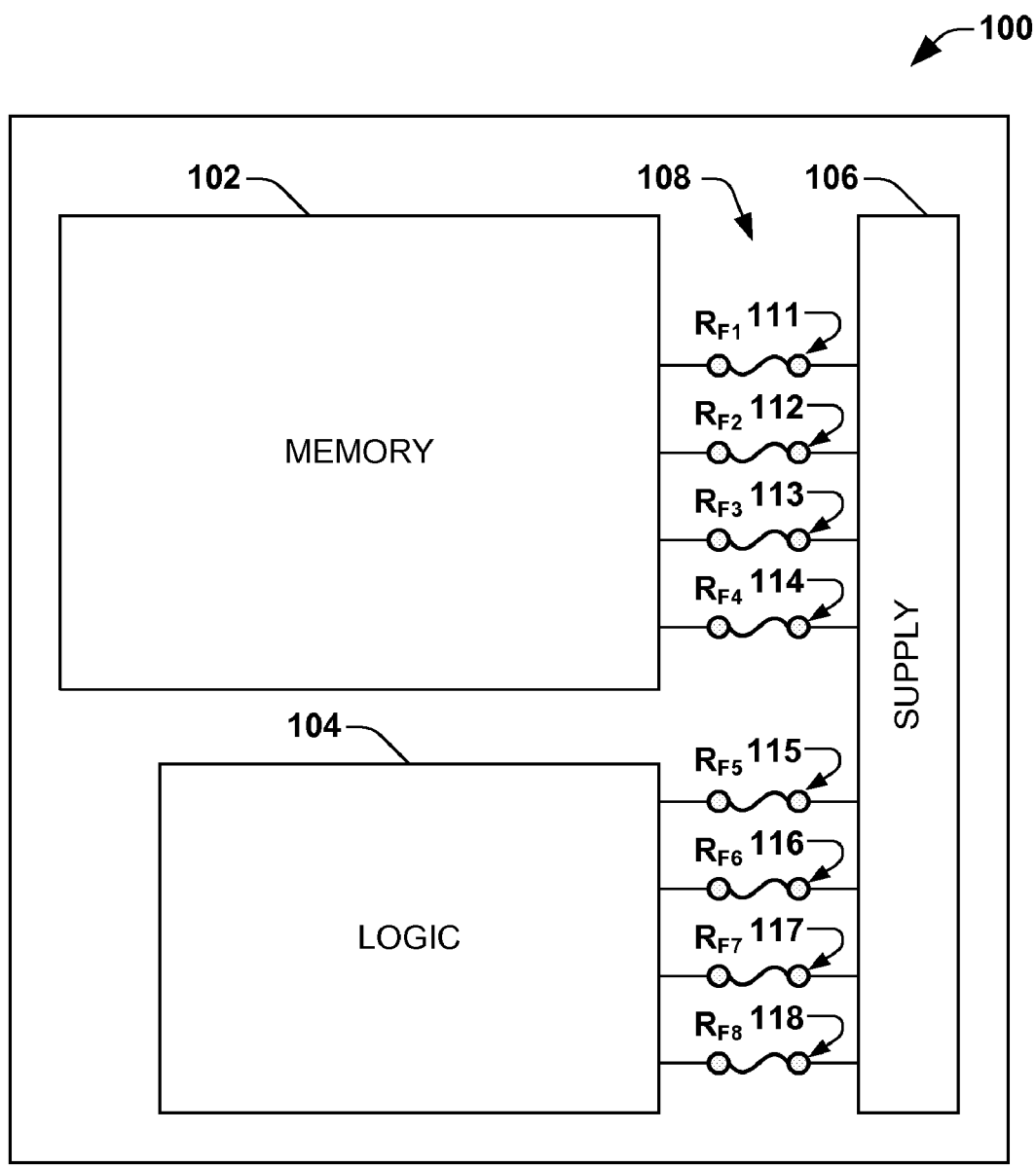
FIG. 1 is a simplified block diagram illustrating programmable fuses used in an integrated circuit to configure logic and/or memory areas of the IC, according to an embodiment of the invention.

One or more implementations of the present invention will now be described with reference to the attached drawings, wherein like reference numerals are used to refer to like elements throughout. The invention relates to a programmable fuse circuit comprising a parallel circuit of a fuse and a resistive element having a known value, for quickly and more accurately sensing the state of the fuse, such as may be used in an integrated circuit or a semiconductor device, for example.

Conventionally, the FUSED or UNFUSED states of a fuse (e.g., programmable fuse, fuse logic, or programmable element) may be sensed, for example, by means of a sense amplifier or complex logic circuitry. However, sensing or confirming the state of a fuse may be problematic as the resistance is unknown after "fusing" or "blowing" the fuse device. In addition, it may be difficult to generate a good reference for reading the state of a programmable fuse, particularly when the distribution of possible resistance values is substantially wide after fusing. Further, the state of fuses used to program device configurations may need to be known quickly, such as during power-up of the device. Thus, there is a need for a means to quickly and accurately determine the FUSED or UNFUSED state of a fuse, in order to properly identify and program the configuration of a device in a timely manner.

In one embodiment of the invention, the reference may be provided by paralleling the fuse with a known resistive element. In one embodiment of the invention, the reference may be provided by locally paralleling each programmable fuse with a corresponding known resistive element, for example, for fast response on power-up of a device to quickly identify a configuration. In another embodiment, a single known resistive element may be associated with a plurality of fuses and a selection circuit configured to select one of the plurality of fuses for comparison sensing with the known resistive element, for example, in order to minimize less circuitry in a slower, after power-up configuration application, for example.

The resistance of the known resistive element may be a relatively high resistance, with respect to the UNFUSED resistance value. In particular, the known resistor may have a value that generally resides between (e.g., midway between) the greatest (upper limit) resistance value of the UNFUSED state and the smallest (lower limit) resistance value of the FUSED state. In another embodiment, the known resistance value may be within the FUSED state distribution of values.

Turning to FIG. 1, is a simplified block diagram of an integrated circuit 100 illustrating a plurality of programmable fuses used to configure logic and/or memory areas of the IC according to an embodiment of the invention.

The integrated circuit 100 of FIG. 1, for example, comprises a memory region or array 102, a logic region 104, a supply region 106, and a plurality of programmable fuses 108, comprising $R_{F1}$ (111), $R_{F2}$ (112) . . . $R_{F8}$ (118), for example, used to configure the logic 104 and/or the memory areas 102 of the IC 100 in one or more embodiments of the invention. Typically, such fuses (e.g., programmable fuses, or other such programmable elements), may be programmed to one of two states by application of a programming pulse comprising a laser pulse or a high energy electrical pulse, for example. If a fuse is programmed by the programming pulse (electrical or laser pulse), the fuse is "blown" into a "FUSED" state or high resistance state. Alternately, if the fuse is left unprogrammed by the programming pulse, the fuse is said to have an "UNFUSED" state or low resistance state.

Upon power-up, or at another appropriate time, as determined by the particular integrated circuit application, the state of the fuse is then sensed and determined, to identify the desired logic and/or memory configuration(s) that each programmable fuse is intended to signify. For example, fuse $R_{F1}$ (111) may be connected between a supply ground, Vss, or Vdd terminal of supply 106 and a sector of memory array 102. If the fuse $R_{F1}$ (111) is blown by a laser pulse to a FUSED (high resistance) state, this may be used to change a basic memory configuration of the array. It should also be appreciated, that the programmable fuses 108, also need not be connected to a supply such as supply 106, but may also be used as a single bit memory cell to retain a configuration state. In either case, the FUSED or UNFUSED state of a programmable fuse may be sensed and determined using a sense circuit, for example.

Figure 2:
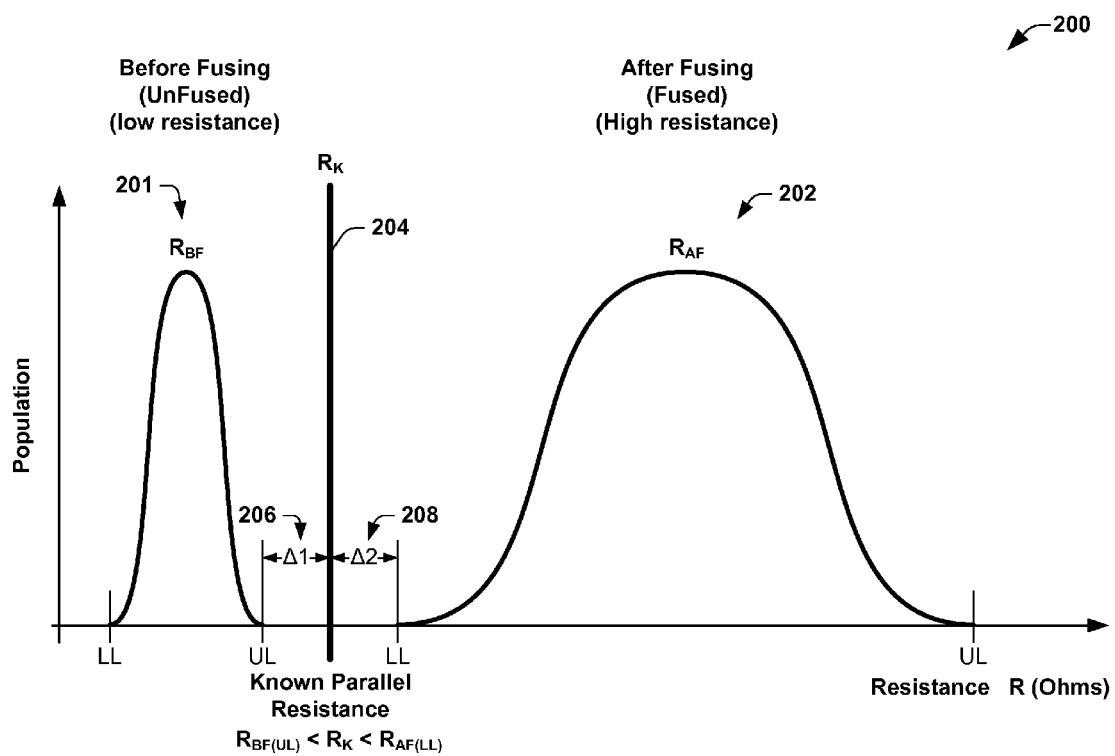
FIG. 2 is diagram illustrating a population of programmable fuse resistance values grouped into a FUSED and an UNFUSED population distributions according to an embodiment of the invention.

FIG. 2 illustrates a population 200 of programmable fuse resistance values grouped into an UNFUSED distribution 201 and an FUSED distribution 202 of the population, according to an embodiment of the invention.

The UNFUSED distribution 201 of FIG. 2 represents the low resistance state or UNFUSED state of the fuses, comprising the population distribution of resistance values of the fuses before fusing $R_{BF}$. The UNFUSED population distribution 201 ranges from a lowest resistance value of the population at a lower limit resistance $R_{BF(LL)}$ to a greatest resistance value of the population at an upper limit resistance $R_{BF(UL)}$. This UNFUSED resistance value range is usually relatively narrow, as the resistance of the fuse conductive material may be relatively low.

The FUSED distribution 202 of FIG. 2 represents the high resistance state or FUSED state of the fuses, comprising the population distribution of resistance values of the fuses after fusing $R_{AF}$. The FUSED population distribution 202 ranges from a lowest resistance value of the population at a lower limit resistance $R_{AF(LL)}$ to a greatest resistance value of the population at an upper limit resistance $R_{AF(UL)}$. By contrast to the UNFUSED narrow distribution, the FUSED resistance value range is usually substantially wider, as the carbonized material which remains between the terminals of the fuse may be somewhat conductive, or may also be highly resistive or may even contain voids that result in a very high resistance fuse.

Because of this wide range of resistance values in the FUSED state, the fuses which populate near the upper limit resistance $R_{AF(UL)}$, may have an extremely high resistance value. This high resistance range of the FUSED state devices can make the design of the sense circuitry difficult, and generally slow in response. In particular, during a subsequent sensing operation, the resistance of an unknown fuse state is to be determined. If the fuse is still unprogrammed and in the UNFUSED, low resistance state, sensing of the fuse may be accomplished quickly as the current thru the fuse can be substantially greater than in the FUSED, high resistance state. The higher currents available through the low resistance of the UNFUSED state allow any capacitances within the sense circuit to be rapidly charged or discharged according to the particular sense circuit design. Conversely, when a fuse is blown to a FUSED, high resistance state, only a substantially lower current is available to slowly charge or discharge any capacitances within the sense circuit. Thus, sensing the FUSED, high resistance state of a fuse can be substantially slower and/or may be less accurate.

The inventor of the present invention, however, has appreciated that this resistance range can be dramatically narrowed by paralleling the fuse with a known resistive element, in order to provide faster sense circuit response times while maintaining accurate state determinations. For example, this technique may be particularly useful on power-up or at other times where it is important to rapidly determine the state of a fuse for quickly and accurately configuring a chip.

In one embodiment of the invention, a known parallel resistance $R_K$ (204) is selected which has a value between the upper limit resistance $R_{BF(UL)}$ of the UNFUSED population distribution 201 and the lower limit resistance $R_{AF(LL)}$ of the FUSED population distribution 202, according to:

$$R_{BF(UL)} < R_K < R_{AF(LL)}$$

where
$R_{BF(UL)}$=the upper limit resistance of the UNFUSED state,
$R_K$=known resistance of the resistive element,
$R_{AF(LL)}$=the lower limit resistance of the FUSED state.

Figure 3A:
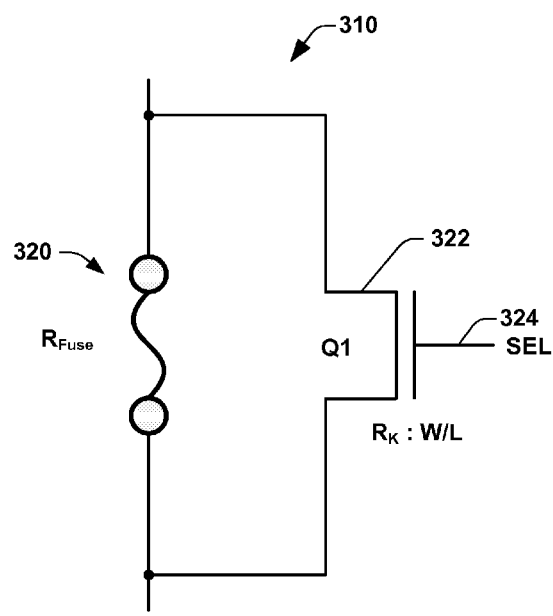
FIGS. 3A and 3B are schematic diagrams illustrating fuse and parallel resistive element circuit embodiments, one comprising a fuse and parallel MOS transistor embodiment, and the other a fuse and parallel resistor/switch circuit embodiment, respectively, in accordance with one or more embodiments of the invention.
Figure 3B:
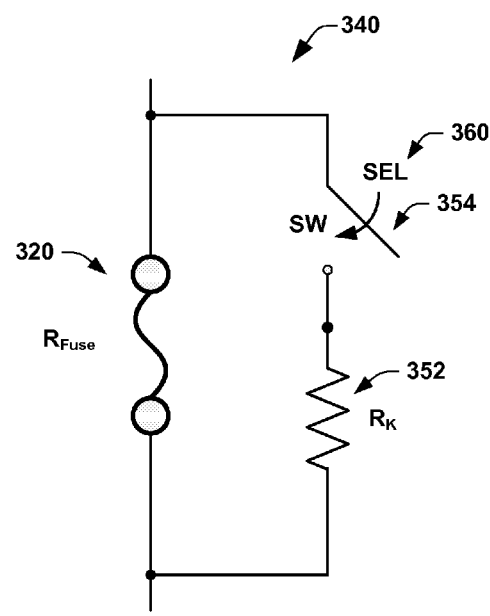

FIGS. 3A and 3B, for example, are schematic diagrams illustrating fuse and parallel resistive element circuit embodiments, one comprising a fuse and parallel MOS transistor embodiment, and the other a fuse and parallel resistor/switch circuit embodiment, respectively, in accordance with one or more embodiments of the invention.

FIG. 3A illustrates a fuse circuit 310 embodiment in accordance with one or more aspects of the invention. Fuse circuit 310 comprises a fuse 320, such as a programmable fuse, or another programmable element having a resistance $R_{FUSE}$, and a parallel resistive element 322, such as a MOS transistor Q1, configured to have a known on-resistance $R_K$, and placed in parallel with the fuse 320. Particularly during electrical programming of the fuse 320, Q1 of parallel resistive element 322 may be turned off via a gate select input SEL 324 to protect itself from the high energy programming pulse used to "blow open" the fuse 320 into the FUSED state. However, if a laser programming pulse is used on fuse 320, Q1 may not need to be turned off. After programming, the fuse resistance $R_{FUSE}$, however, is considered to be unknown until one of the FUSED or UNFUSED states is subsequently determined. Those skilled in the art will appreciate that the MOS transistor lends itself to be configured with a channel Width to Length ratio W/L such that the known on-resistance $R_K$ is proportionate (:) to this W/L ratio, according to:

$$R_K : W/L$$

By establishing and placing the known resistance 322 in parallel with the fuse 310, the range of unknown possible resistances values of the fuse circuit is greatly reduced. For example, assume that the UNFUSED resistance $R_{BF}$ of the fuse 320 is 1 KΩ, the FUSED resistance $R_{AF}$ of the fuse 320 is 10 MΩ, and the known on-resistance $R_K$ is 10K, then the UNFUSED parallel circuit resistance $R_{CKT(BF)}$ of the fuse circuit 310 is:

$$R_{CKT(BF)} = R_{BF} \| R_K = 1\ K\Omega \| 10K = 909\ \Omega, \text{ and}$$

the FUSED parallel circuit resistance $R_{CKT(AF)}$ of the fuse circuit 310 is:

$R_{CKT(AF)} = R_{AF} \| R_K = 10\ M\Omega \| 10K = 9.99\ k\Omega$

By contrast, without the known on-resistance $R_K$ in parallel with fuse 320, the circuit resistance is simply the fuse 320 resistance which is:

the UNFUSED resistance $R_{BF}$=1 KΩ, and the FUSED resistance $R_{AF}$=10 MΩ.

Thus, in this example, we see that the range of possible FUSED resistances values is reduced by about 1000 times, from 10 MΩ to 9.99 kΩ. Also in this example, we see that the UNFUSED fuse resistance value $R_{BF}$, whether in parallel with the known resistance 322 or standing alone, remains in the same basic resistance range of values, for example, 909Ω and 1 KΩ, respectively. It will also be noted that the values used in this parallel fuse circuit technique still provides a significant distinction or contrast between the FUSED state (e.g., at $R_{CKT(BF)}$=909Ω) and the UNFUSED state (e.g., at $R_{CKT(AF)}$=9.99 kΩ), for example, while avoiding a dependence on the wildly varied FUSED state values. Therefore, the embodiment of the present invention offers a method of accurately determining the state of a fuse, using a more well-behaved set of resistance values which permits improved sensing response times, as will be discussed further infra in conjunction with FIG. 4.

FIG. 3B similarly illustrates another fuse circuit 340 embodiment of the invention. Fuse circuit 340 again comprises a fuse 320, such as a programmable fuse, or another programmable element having a resistance $R_{FUSE}$, a parallel resistive element 352, having a known resistance $R_K$, and a series switch 354, the resistive element 352 and the switch 354 placed in parallel with the fuse 320. Again, particularly during electrical programming of the fuse 320, switch 354 may be turned off via a select signal SEL 360 to protect resistive element 352 from the high energy programming pulse used to "blow open" the fuse 320 into the FUSED state. However, if a laser programming pulse is used on fuse 320, switch 354 is optional, and if switch 354 is utilized, it need not be turned off.

Figure 4:
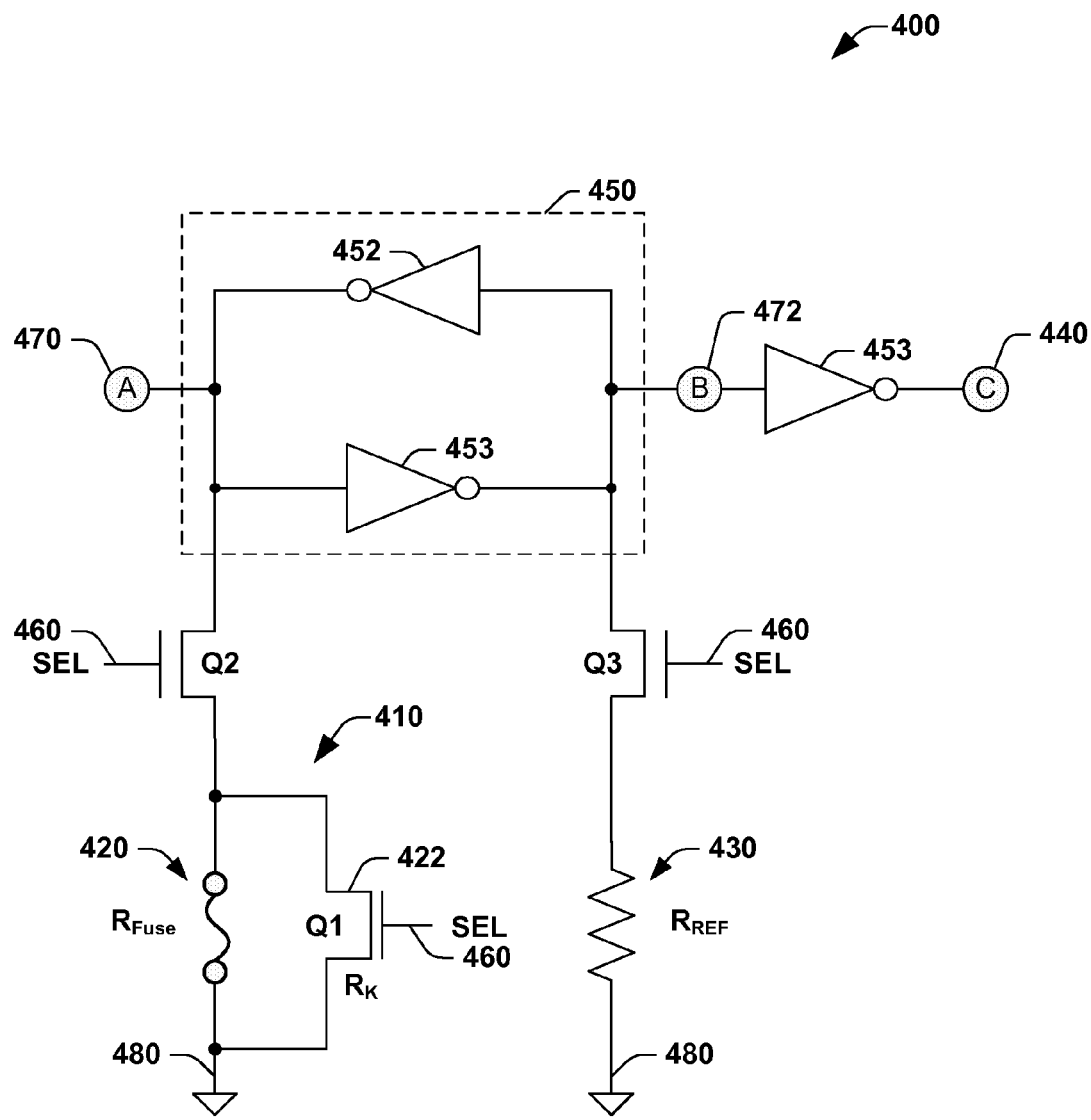
FIG. 4 is a schematic diagram embodiment of a latch type sensing circuit configured for sensing the state of a fuse/MOS transistor circuit similar to the fuse circuit of FIG. 3A, according to another embodiment of the invention.

FIG. 4 illustrates a latch-type sensing circuit 400 configured for sensing the state of a fuse/MOS transistor circuit 410 similar to the fuse circuit 310 of FIG. 3A, according to another embodiment of the invention. The sensing circuit 400 essentially compares the parallel circuit resistance $R_{CKT(AF)}$ of the fuse circuit 410 (which is to be sensed) to a known reference resistance $R_{REF}$ 430, and provides an output at Fuse Out terminal 440 corresponding to one of the determined FUSED or UNFUSED states as a result of the comparison.

In one embodiment, the sensing circuit 400 comprises a latch circuit 450 comprising a pair of cross-coupled inverters 452 and 453. The latch circuit 450 is stable in one of two states comprising a SENSE state when, for example, node A 470 is high and node B 472 is low, or a SENSE-BAR state when node B 472 is high and node A 470 is low. Accordingly, output inverter 453 buffers the SENSE-BAR node B 472 to Fuse Out terminal 440. The latch circuit 450 also comprises a sense select transistor Q2 to couple the fuse circuit 410 to node A 470 of latch 450, and a sense select transistor Q3 to couple the known reference resistor $R_{REF}$ 430 to node B 472 of latch 450. In one embodiment, the select devices Q1, and Q2 need not be included to reduce the number of devices used. However, such a configuration generally increases static stand-by current.

In one embodiment, fuse circuit 410 comprises a fuse 420 having a resistance $R_{FUSE}$ and a resistive element 422 having a known resistance $R_K$ in parallel with the fuse 420. In the present embodiment, fuse circuit 410 and the known reference resistor $R_{REF}$ 430 are connected to a ground potential GND 480.

During a sensing operation of the fuse circuit 410, the gate terminals of Q1, Q2, and Q3 are enabled by select signal SEL 460, coupling the fuse circuit 410 to node A 470 of latch 450, and the reference resistor $R_{REF}$ 430 to node B 472 of latch 450. In response to the resistance difference between the fuse circuit 410 and the reference resistor $R_{REF}$ 430, the latch 450 switches to one of the SENSE or SENSE-BAR states corresponding to one of the FUSED or UNFUSED states, respectively, of the fuse 420.

For example, assume the following circuit values:

$R_{Fuse} = R_{BF}$=1 kΩ=UNFUSED resistance of fuse 420 before fusing.

$R_{Fuse} = R_{AF}$=10 MΩ=FUSED resistance of fuse 420 after fusing.

$R_K$=10 KΩ=known resistance of parallel resistive element 422.

$R_{REF}$=5 KΩ=known resistance of reference resistor 430.

$R_{CKT(BF)} = R_{BF} \| R_K = 1\ K\Omega \| 10K = 909\Omega$, and $R_{CKT(AF)} = R_{AF} \| R_K = 10\ M\Omega \| 10K = 9.99\ k\Omega$ Before fusing, the fuse circuit 410 has a resistance of $R_{CKT(BF)}$=909Ω, which is much lower than the reference resistor at $R_{REF}$=5 KΩ, thus node A 470 is pulled lower than node B 472, so node B 472 goes high, which causes the Fuse Out 440 terminal to go low corresponding to an UNFUSED state indication of the fuse 420. Similarly, after fusing, the fuse circuit 410 has a resistance of $R_{CKT(AF)}$=9.99 kΩ, which is much higher than the reference resistor at $R_{REF}$=5 KΩ, thus node B 472 is pulled lower than node A 470, so node A 470 goes high. The low state on B 472 then causes the Fuse Out 440 terminal to go high corresponding to a FUSED state indication of the fuse 420. Accordingly, it will be noted that the lower resistance values provided by the parallel known resistance of resistive element 422 permits a rapid determination of the state of the fuse 420, particularly where such determinations are required quickly.

In one embodiment, a plurality of such fuse circuits (e.g., 310, 340, 410) may be sensed by a single sense circuit (e.g., sense circuit 400 of FIG. 4) in the context of the embodiments of the present invention, for example, using a plurality of selection transistors similar to Q2, a multiplexer, or another such selection circuit means. In other words, a sense circuit may be provided associated with one or more respective fuses configured to read the state of the respective fuse.

In one embodiment, the fuse and known parallel resistance are placed local to each other, or spatially disposed adjacent to each other to minimize local variations between the characteristics of the elements. For example, the fuse (e.g., 420) may have an overall length X, while the known parallel resistance (e.g., 322, 352, 422) may have an overall length Y. The fuse and the known parallel resistance may be spatially disposed to within a distance of X or Y of each other to help define a measure of the relative proximity of these devices.

In another embodiment, the fuse and known parallel resistance may be spatially disposed adjacent to each other within the same n-well, the same p-well, or within such a distance that no other components reside therebetween on the same integrated circuit. In another embodiment, one of a plurality of fuses and a known parallel resistance are spatially disposed adjacent to each other within a distance of X or Y of each other, within the same n-well, the same p-well, or within such a distance that no other components have adequate space to reside therebetween within the same integrated circuit.

In one embodiment, the known resistance $R_K$ of the resistive element has a value between an upper limit resistance value $R_{BF(UL)}$ of an UNFUSED state of the fuse and a lower limit resistance value $R_{AF(LL)}$ of a FUSED state of the fuse, according to:

$$R_{BF(UL)} < R_K < R_{AF(LL)}$$

where $R_{BF(UL)}$=the upper limit resistance value of the UNFUSED state, $R_K$=known resistance of the resistive element, $R_{AF(LL)}$=the lower limit resistance value of the FUSED state.

In another embodiment, the known resistance value $R_K$ of the resistive element of the fuse circuit (e.g., 310, 340, 410) is greater than or equal to the lower limit resistance value $R_{AF(LL)}$ of a FUSED state of the fuse, according to:

$$R_K \geq R_{AF(LL)}$$

In one embodiment, the resistive element comprises a MOS transistor and the known resistance is proportionate to or otherwise based on a known channel width to length ratio W/L.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A fuse circuit, comprising:
a fuse configured for programming a configuration of an integrated circuit device; and
a resistive element configured to establish a known resistance value, the resistive element operably coupled in parallel with the fuse;
wherein the fuse and the resistive element form a parallel circuit configured for sensing a state of the fuse in relation to the known value of the resistive element; and
wherein the known resistance of the resistive element has a value between an upper limit resistance of an UNFUSED state of the fuse and a lower limit resistance of a FUSED state of the fuse;
wherein the fuse and the resistive element are spatially disposed adjacent to one another, residing within one of: a single length of the fuse, the same n-well, the same p-well, a length of the resistive element of one another, and within such a distance that no other components have adequate space to reside therebetween within the same integrated circuit.

2. The fuse circuit of claim 1, wherein the fuse is a programmable element.

3. The fuse circuit of claim 1, wherein the resistive element comprises a MOS transistor having a known on-resistance value based on a known channel width to length ratio W/L, and configured to switch the known resistance of the transistor in parallel with the fuse during the sensing of the state of the fuse.

4. The fuse circuit of claim 1, further comprising a transistor connected in series between the resistive element and the fuse, the transistor configured to switch the resistive element in parallel with the fuse.

5. The fuse circuit of claim 4, further comprising a sense circuit operably coupled to the fuse and the resistive element, the sense circuit configured to sense one of the FUSED state and the UNFUSED state of the fuse.

6. The fuse circuit of claim 5, wherein the sense circuit comprises a latch circuit.

7. The fuse circuit of claim 1, further comprising a sense circuit operably coupled to the fuse and the resistive element, wherein the sense circuit is configured to sense one of the FUSED state and the UNFUSED state of the fuse, based on a comparison between a resistance of the parallel circuit and a reference resistor configured to establish a known value.

8. The fuse circuit of claim 1, wherein the known resistance of the resistive element is greater than or equal to the lower limit resistance of the FUSED state of the fuse.

9. A fuse circuit, comprising:
one or more fuses, wherein at least one fuse is configured to program a configuration of an integrated circuit device;
a MOS transistor configured to establish a known on-resistance value, the transistor configured to be switched in parallel with one of the fuses to form a parallel circuit configured for sensing a state of the fuse in relation to the known value of the MOS transistor; and
a sense circuit operably associated with the parallel circuit, wherein the sense circuit is configured to sense one of a FUSED state and an UNFUSED state of the fuse;
wherein at least one fuse and the MOS transistor are spatially disposed local to one another, residing within one of: a single length of the fuse, the same n-well, the same p-well, and a length of the MOS transistor of one another.

10. The fuse circuit of claim 9, wherein at least one of the fuses is a programmable fuse.

11. The fuse circuit of claim 9, wherein the known on-resistance value of the MOS transistor is based on a known channel width to length ratio W/L, and the transistor is configured to switch the known resistance of the transistor in parallel with a fuse during the sensing of the state of the fuse.

12. The fuse circuit of claim 9, wherein the sense circuit comprises one of a latch circuit and a logic circuit.

13. The fuse circuit of claim 9, wherein the known resistance of the MOS transistor has a value between an upper limit resistance value of the UNFUSED state of the fuse and a lower limit resistance value of the FUSED state of the fuse, according to:

$$R_{BF(UL)} < R_K < R_{AF(LL)}$$

where $R_{BF(UL)}$=the upper limit resistance value of the UNFUSED state, $R_K$=known resistance of the MOS transistor, and $R_{AF(LL)}$=the lower limit resistance value of the FUSED state.

14. A fuse circuit, comprising:
- fusable programming means for programming the configuration of an integrated circuit device;
- known resistance means for providing a known resistance value;
- reference resistance means for providing a reference resistance value; and
- sensing means operably associated with the known resistance means and the fusable programming means, wherein the sensing means is configured to sense one of a FUSED state and an UNFUSED state of the fusable programming means, based on a comparison between the reference resistance value and a parallel circuit resistance of the known resistance means and the fusable programming means.

15. The fuse circuit of claim 14, further comprising switching means connected in series between the known resistance means and the fusable programming means for switching the known resistance means in parallel with the fusable programming means.

16. The fuse circuit of claim 14, wherein the known resistance means comprises a MOS transistor, and the known resistance value is based on a known channel width to length ratio W/L.

17. The fuse circuit of claim 14, wherein the sensing means comprises a latch circuit.

18. The fuse circuit of claim 14, wherein the known resistance of the known resistance means has a value between an upper limit resistance of the UNFUSED state and a lower limit resistance of the FUSED state.

19. A fuse circuit, comprising:
- one or more fuses, wherein at least one fuse is configured to program a configuration of an integrated circuit device;
- a MOS transistor configured to establish a known on-resistance value, the transistor configured to be switched in parallel with one of the fuses to form a parallel circuit configured for sensing a state of the fuse in relation to the known value of the MOS transistor; and
- a sense circuit operably associated with the parallel circuit, wherein the sense circuit is configured to sense one of a FUSED state and an UNFUSED state of the fuse;
- wherein the sense circuit is configured to sense one of the FUSED state and the UNFUSED state of the fuse, based on a comparison between a reference resistor configured to establish a known value and a parallel circuit resistance comprising a FUSED resistance of the fuse and the known on-resistance value of the transistor.

\* \* \* \* \*